United States Patent
Kim et al.

(10) Patent No.: US 11,669,280 B2
(45) Date of Patent: Jun. 6, 2023

(54) STORAGE DEVICE AND OPERATING METHOD THEREOF

(71) Applicant: SK hynix Inc., Icheon-si (KR)

(72) Inventors: Woo Hyun Kim, Icheon-si (KR); Hyun Jun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/646,587

(22) Filed: Dec. 30, 2021

(65) Prior Publication Data
US 2022/0382486 A1   Dec. 1, 2022

(30) Foreign Application Priority Data
Jun. 1, 2021 (KR) .......................... 10-2021-0070775

(51) Int. Cl.
*G06F 3/06* (2006.01)

(52) U.S. Cl.
CPC ............ *G06F 3/0659* (2013.01); *G06F 3/061* (2013.01); *G06F 3/0658* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 10,915,266 B2* | 2/2021 | Ochi | G06F 3/0611 |
| 2016/0210050 A1* | 7/2016 | Hyun | G06F 3/0611 |
| 2018/0032282 A1* | 2/2018 | Hahn | G06F 3/0604 |
| 2020/0135283 A1* | 4/2020 | Park | G11C 16/16 |

FOREIGN PATENT DOCUMENTS

| | | |
|---|---|---|
| KR | 10-2083490 | 3/2020 |
| KR | 10-2020-0046807 | 5/2020 |

OTHER PUBLICATIONS

Eric Wright, Eyal de Lara, and Ashvin Goel. 2011. Vision: The case for context-aware selective resume. In Proceedings of the second international workshop on Mobile cloud computing and services (MCS '11). Association for Computing Machinery, New York, NY, USA, 1-6. (Year: 2011).*

* cited by examiner

*Primary Examiner* — Khoa D Doan
(74) *Attorney, Agent, or Firm* — Weaver Austin Villeneuve & Sampson LLP

(57) ABSTRACT

A memory controller controlling an operation of a memory device including a plurality of memory cells may provide a first suspend command instructing the memory device to suspend performance of the first operation, provide a command requesting information on a target period in which the first operation is suspended among the plurality of periods, provide a command instructing a second operation to the memory device, provide a resume command instructing the memory device to resume the performance of the first operation after the second operation is ended, and provide a second suspend command instructing the memory device to re-suspend the performance of the first operation after a delay elapses from a time at which the resume command is provided, the delay being based on the delay information corresponding to the target period.

20 Claims, 16 Drawing Sheets

|   | SUS_INF_REQ |
|---|---|
| 1 | STATUS READ COMMAND(Status Read) |
| 2 | PARAMETER GET COMMAND(Get Parameter) |
| 3 | FEATURE GET COMMAND(Get Feature) |

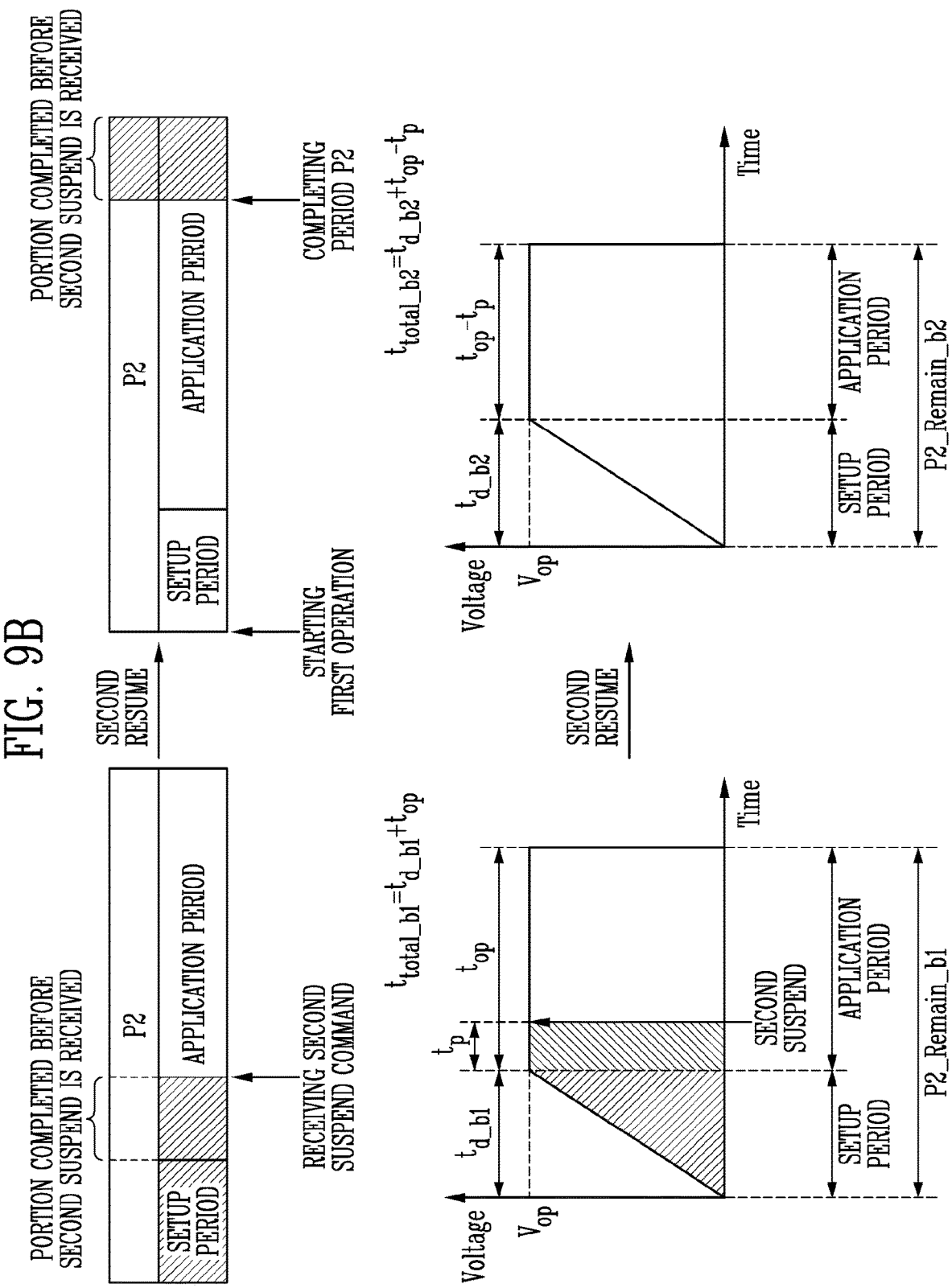

| PERIOD | DELAY INFORMATION ||
| --- | --- | --- |
|  | case 1 | case 2 |
| P1 | d1 | d5 |
| P2 | d2 |  |
| P3 | d3 | d6 |
| P4 | d4 |  |

STORAGE DEVICE AND OPERATING METHOD THEREOF

CROSS-REFERENCE TO RELATED APPLICATION

The present application claims priority under 35 U.S.C. § 119(a) to Korean Patent Application Number 10-2021-0070775, filed on Jun. 1, 2021, which is herein incorporated by reference in its entirety for all purposes.

BACKGROUND

1. Technical Field

The present disclosure generally relates to an electronic device, and more particularly, to a storage device and an operating method thereof.

2. Related Art

A storage device is a device which stores data under the control of a host device such as a computer or a smart phone. The storage device may include a memory device for storing data and a memory controller for controlling the memory device. The memory device can be classified into a volatile memory device or a nonvolatile memory device.

The volatile memory device is a memory device in which data is stored only when power is supplied, and the stored data disappears when the supply of power is interrupted. Examples of a volatile memory device may include a Static Random Access Memory (SRAM), a Dynamic Random Access Memory (DRAM), and the like.

The nonvolatile memory device is a memory device in which data does not disappear even when the supply of power is interrupted. Examples of a nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device having improved suspend and resume performance and an operating method of the storage device.

In accordance with an aspect of the present disclosure, there is provided a memory controller for controlling an operation of a memory device including a plurality of memory cells, the memory controller including: an operation controller configured to provide the memory device with a command instructing a first operation including a plurality of periods; a suspend controller configured to provide the memory device with a first suspend command instructing the memory device to suspend performance of the first operation and then provide the memory device a command requesting information on a target period in which the first operation is suspended among the plurality of periods; and a delay information storage configured to store delay information corresponding to each of the plurality of period, wherein the operation controller provides the memory device with a command instructing a second operation, after the suspend controller provides the memory device with the command requesting the information on the target period, and wherein the suspend controller provides the memory device with a resume command instructing the memory device to resume the performance of the first operation after the second operation is ended, and provides the memory device with a second suspend command instructing the memory device to re-suspend the performance of the first operation after a delay elapses from a time at which the resume command is provided, wherein the delay is based on the delay information corresponding to the target period.

In accordance with another aspect of the present disclosure, there is provided a storage device including: a memory device configured to perform an operation including a plurality of periods on a plurality of memory cells, suspend performance of the operation in response to a first suspend command, generate information on a period in which the performance of the operation is suspended among the plurality of periods, and resume the performance of the operation in response to a resume command; and a memory controller configured to get the information on the period in which the performance of the operation is suspended from the memory device after the first suspend command is provided to the memory device, and provide a second suspend command to the memory device after a delay elapses from when the resume command is provided to the memory device, wherein the delay is determined according to the period in which the performance of the operation is suspended.

In accordance with still another aspect of the present disclosure, there is provided a method for operating a memory controller for controlling a memory device including a plurality of memory cells, the method including: providing the memory device with a first suspend command instructing the memory device to suspend performance of a first operation while the first operation is being performed; providing the memory device with a command requesting information on a period in which the first operation is suspended; determining delay information corresponding to the period in which the first operation is suspended, based on the information on the period in which the first operation is suspended; providing the memory device with a command to perform a second operation; providing the memory device with a resume command instructing the memory device to resume the performance of the first operation after the second operation has been performed; and instructing the memory device to re-suspend the performance of the first operation after a delay elapses from when the resume command is provided, wherein the delay is based on the delay information corresponding to the period in which the first operation is suspended.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 9B is a diagram illustrating an operation of the memory device receiving the suspend command in the application period in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, exemplary embodiments of the present disclosure will be described in detail with reference to the accompanying drawings in order for those skilled in the art to be able to readily implement the technical spirit of the present disclosure.

Figure 1:
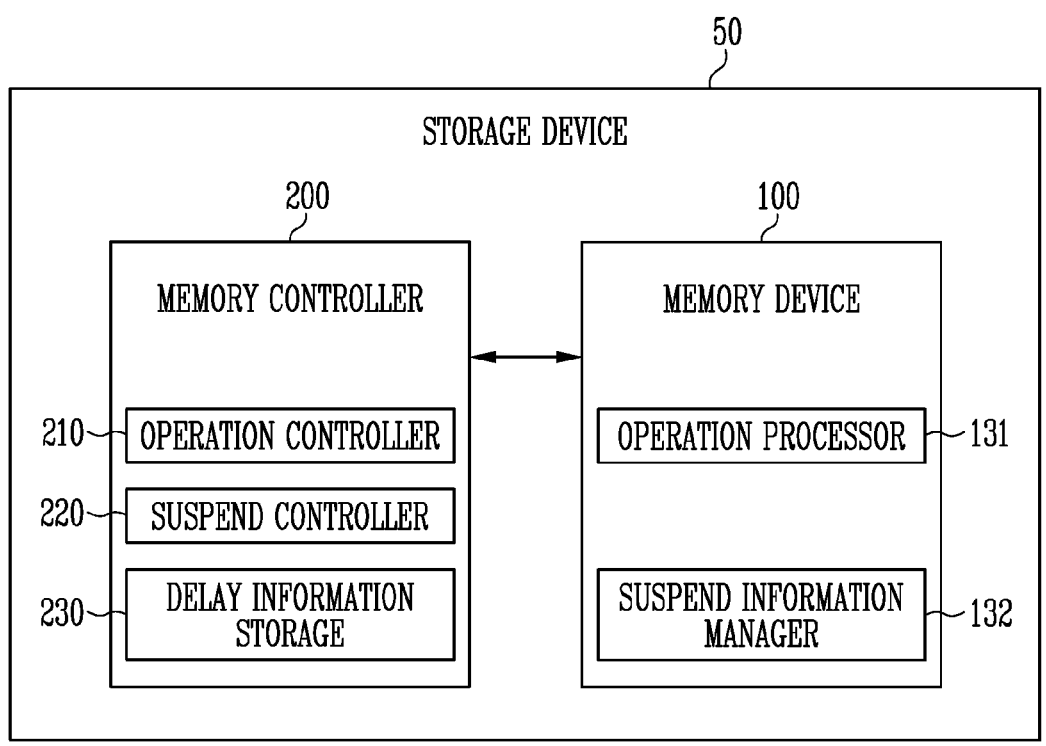
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment system.

The storage device 50 may be manufactured as any one of various types of storage devices according to a host interface that provides a communication scheme to communicate with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control the overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance.

The host may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

In an embodiment, when performance of another operation is required while the memory controller 200 is performing an erase operation or a program operation, the memory controller 200 may suspend the operation being performed by the memory device 100. Specifically, the memory controller 200 may provide a suspend command to the memory device 100. The memory device 100 receiving the suspend command may suspend the operation being performed.

The memory controller 200 may control the memory device 100 to resume the suspended operation after the memory device 100 performs that other operation. For example, the memory controller 200 may again provide the memory device 100 with an erase command for an erase target memory block on which the erase operation is suspended. Alternatively, the memory controller 200 may provide the memory device 100 with a resume command instructing the memory device 100 to resume the suspended operation.

In an embodiment, the memory controller 200 may include an operation controller 210, a suspend controller 220, and a delay information storage 230.

The operation controller 210 may provide the memory device 100 with a command instructing a first operation, a second operation, or a third operation. The first operation may be a program or erase operation. The second operation or the third operation may be a read operation.

The suspend controller 220 may provide the memory device 100 with a command instructing the memory device 100 to suspend the first operation being performed. The suspend controller 220 may provide the memory device 100 with a command instructing the memory device 100 to resume the suspended operation. The suspend controller 220 may provide the memory device 100 with a command requesting information on a target period as information on a time at which the operation is suspended.

The delay information storage 230 may generate and output a delay value, based on the information on the target period, which is received from the memory device 100.

In an embodiment, the memory device 100 may include an operation processor 131 and a suspend information manager 132.

The operation processor 131 may perform an operation corresponding to a command of the memory controller 200 in response to the command. The operation processor 131 may provide the suspend information manager 132 with information on a target period when the operation processor 131 receives the suspend command from the memory controller 200.

The suspend information manager 132 may provide the memory controller 200 with the information on the target period in response to information request for the target period from the memory controller 200. This will be described in detail with reference to FIG. 4.

Figure 2:
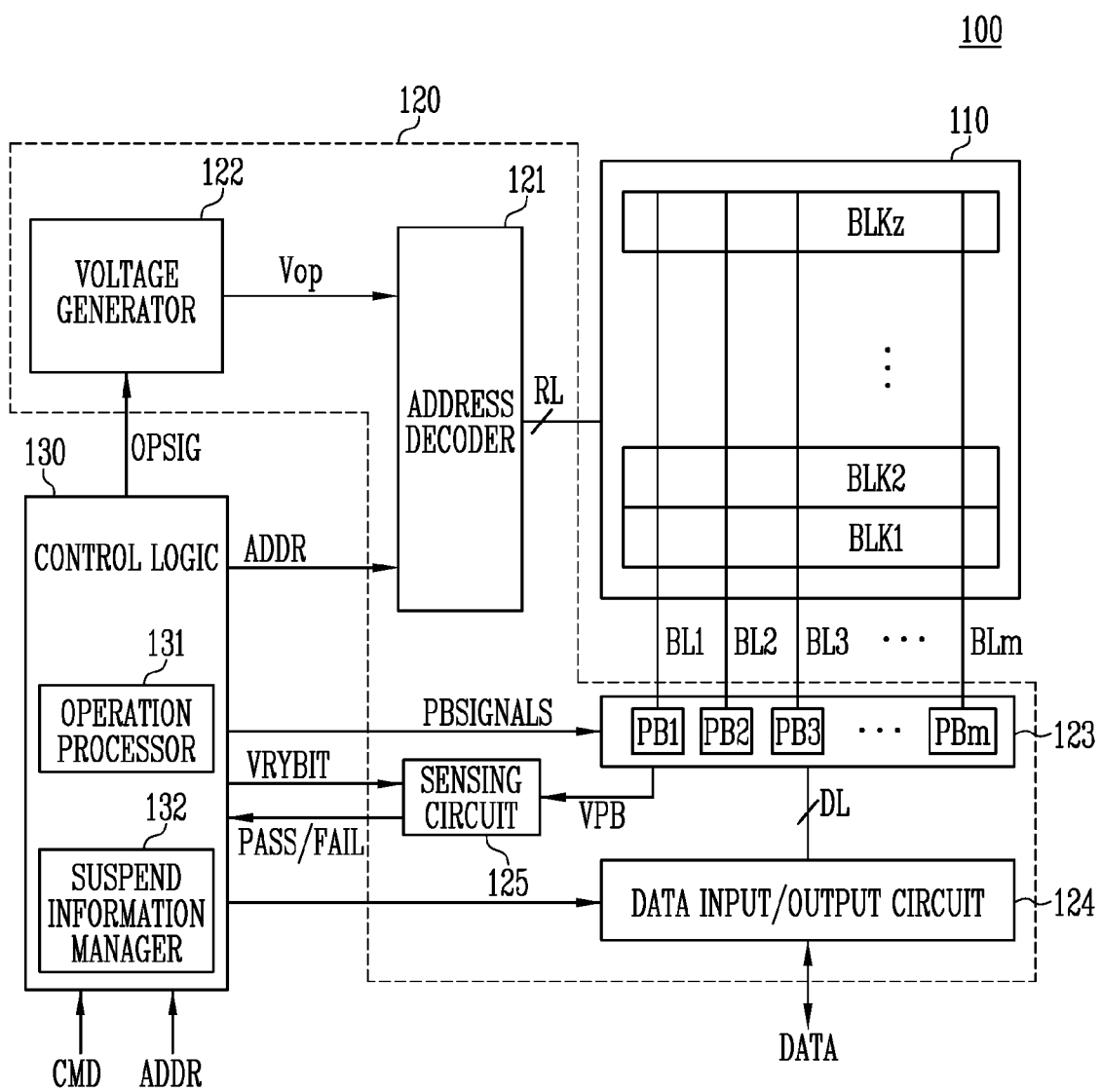
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages.

Each of the memory cells of the memory device 100 may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line of the selected memory block by applying voltages provided from the voltage generator 122 to the at least one word line according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a read pass voltage higher than the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. Exemplarily, the address decoder 121 may include components such as a row decoder, a column decoder, and an address buffer.

The voltage generator 122 may generate a plurality of voltages by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of voltages having various voltage levels, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the address decoder 121.

The read/write circuit 123 includes first to $m^{th}$ page buffers PB1 to PBm. The first to $m^{th}$ page buffers PB1 to PBm are connected to the memory cell array 110 through the respective first to $m^{th}$ bit lines BL1 to BLm. The first to $m^{th}$ page buffers PB1 to PBm operate under the control of the control logic 130.

The first to $m^{th}$ page buffers PB1 to PBm communicate data DATA with the data input/output circuit 124. In a program operation, the first to $m^{th}$ page buffers PB1 to PBm receive data DATA to be stored through the data input/output circuit 124 and data lines DL.

In a program operation, the first to $m^{th}$ page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to $m^{th}$ page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to $m^{th}$ page buffers PB1 to PBm.

In an erase operation, the read/write circuit 123 may float the bit lines BL. In an embodiment, the read/write circuit 123 may include a column select circuit.

The data input/output circuit 124 is connected to the first to $m^{th}$ page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to $m^{th}$ page buffers PB1 to PBm included in the read/write circuit 123.

In a read operation or verify operation, the sensing circuit 125 may generate a reference current in response to an allow bit VRYBIT signal generated by the control logic 130, and output a pass or fail signal PASS/FAIL to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the control logic 130 may include an operation processor 131 and a suspend information manager 132. The operation processor 131 may perform an operation or suspend an operation being performed according to a command received from the memory controller. The suspend information manager 132 may generate information on a period in which the operation is suspended and provide the generated information to the memory controller, in response to a suspend command of the memory controller. In various embodiments, the operation processor 131 and the suspend information manager 132 may be separate from the control logic 130.

Figure 3:
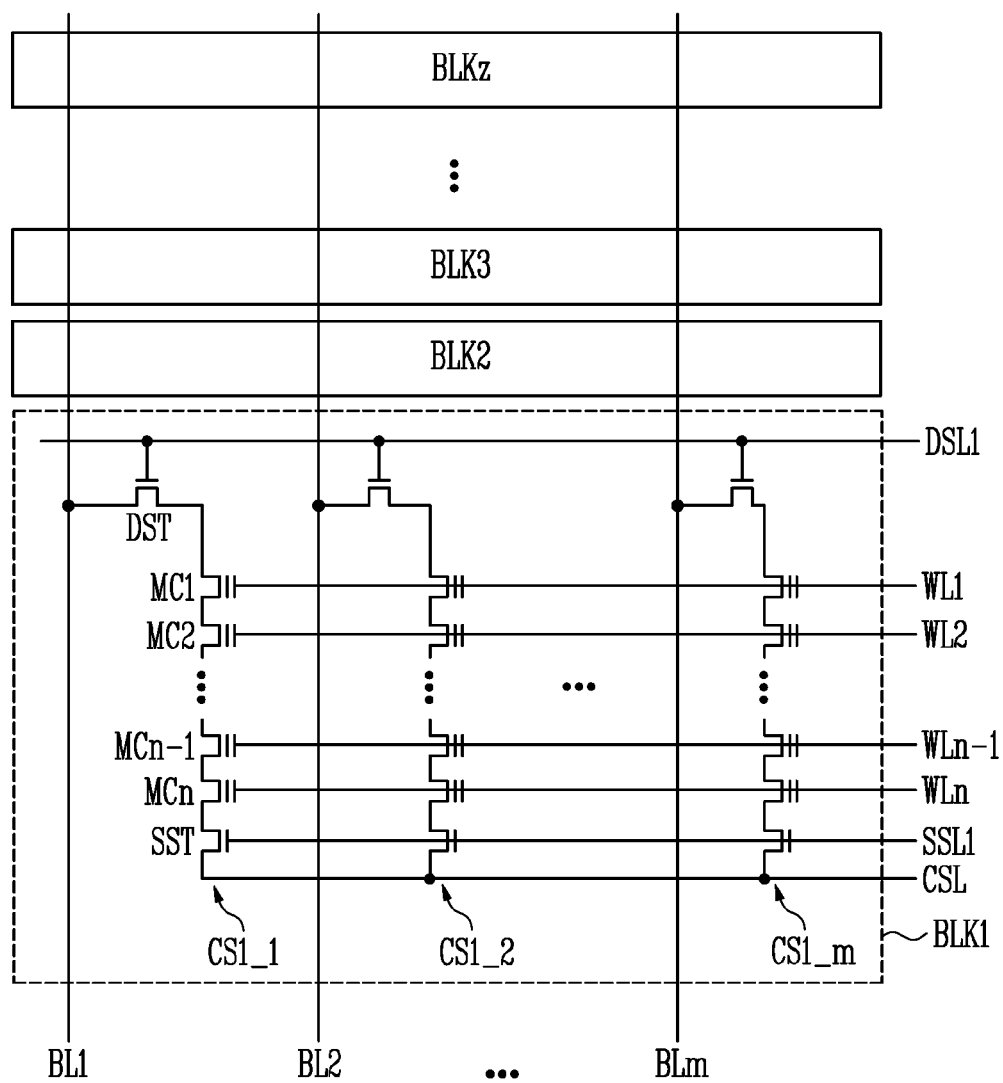
FIG. 3 is a diagram illustrating a memory cell array shown in FIG. 2.

FIG. 3 is a diagram illustrating the memory cell array shown in FIG. 2.

Referring to FIG. 3, first to $z^{th}$ memory blocks BLK1 to BLKz are commonly connected to the first to $m^{th}$ bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_m (m is a positive integer). First to $m^{th}$ cell strings CS1_1 to CS1_m are respectively connected to the first to $m^{th}$ bit lines BL1 to BLm. Each of the first to $m^{th}$ cell strings CS1_1 to CS1_m includes a drain select transistor DST, a plurality of memory cells MC1 to MCn (n is a positive integer) connected in series, and a source select transistor SST.

A gate terminal of the drain select transistor DST included in each of the first to $m^{th}$ cell strings CS1_1 to CS1_m is connected to a drain select line DSL1. Gate terminals of first to nth memory cells MC1 to MCn included in each of the first to $m^{th}$ cell strings CS1_1 to CS1_m are respectively connected to first to nth word lines WL1 to WLn. A gate terminal of the source select transistor SST included in each of the first to $m^{th}$ cell strings CS1_1 to CS1_m is connected to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source electrode of the drain select transistor DST included in the first cell string CS1_1 is connected to a drain terminal of the first memory cell MC1 included in the first cell string CS1_1. The first to nth memory cells MC1 to MCn are connected in series to each other. A drain terminal of the source select transistor SST included in the first cell string CS1_1 is connected to a source terminal of the nth memory cell MCn included in the first cell string CS1_1. A source terminal of the source select transistor SST included in the first cell string CS1_1 is connected to a common source line CSL. In an embodiment, the common source line CSL may be commonly connected to the first to $z^{th}$ memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to $m^{th}$ bit lines BL1 to BLm are controlled by the read/write circuit 123 shown in FIG. 2.

Figure 4:
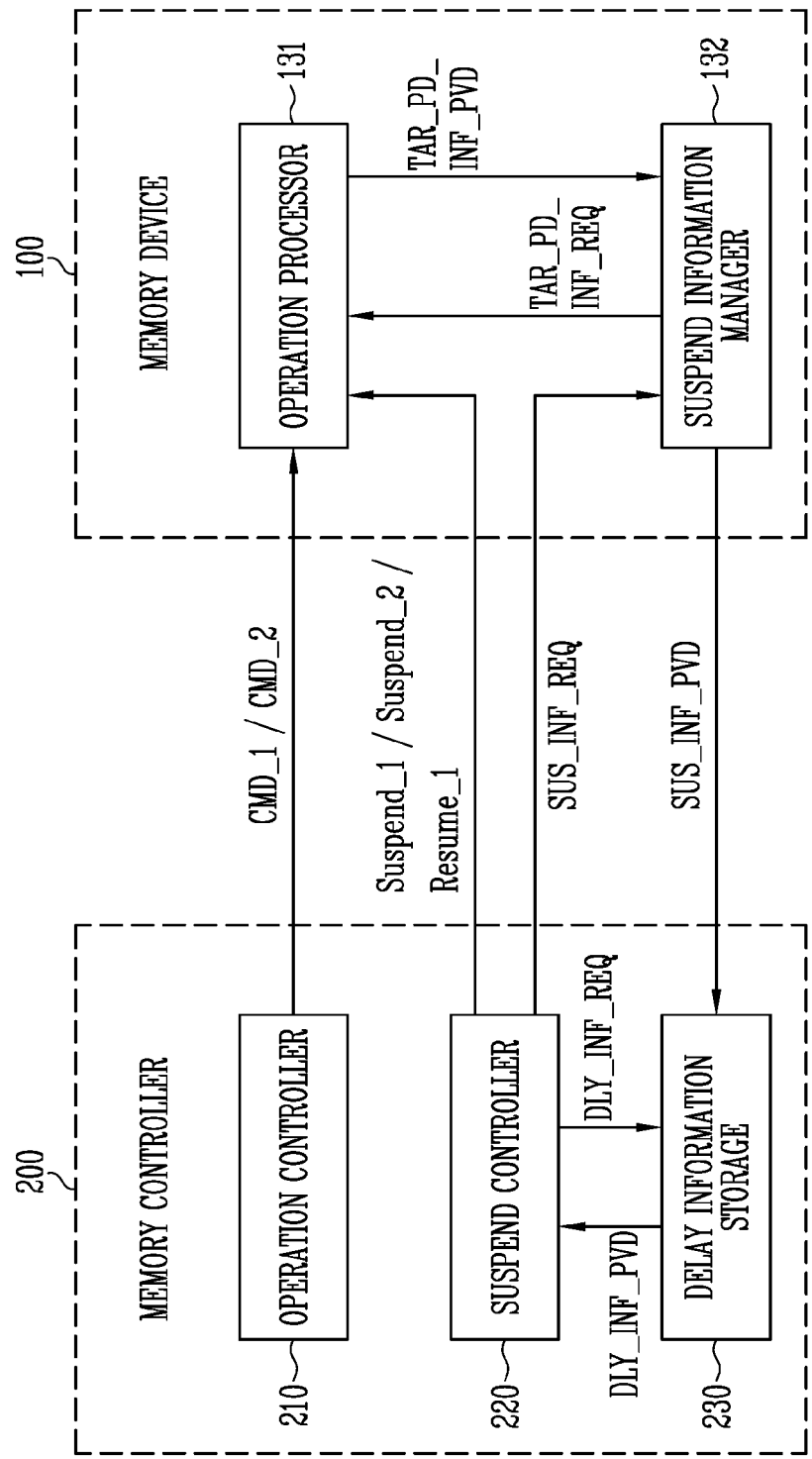
FIG. 4 is a diagram illustrating configurations and operations of a memory controller and the memory device in accordance with an embodiment of the present disclosure.

FIG. 4 is a diagram illustrating configurations and operations of a memory controller and the memory device in accordance with an embodiment of the present disclosure.

Referring to FIG. 4, the memory controller 200 may include an operation controller 210, a suspend controller 220, and a delay information storage 230. The memory device 100 may include an operation processor 131 and a suspend information manager 132.

The operation controller 210 may provide the operation processor 131 with a command CMD_1 instructing the memory device 100 to perform a first operation, and the operation processor 131 may perform the first operation in response to the command CMD_1. The first operation may be any one of an erase operation of erasing data stored in a plurality of memory cells and a program operation of storing data in a plurality of memory cells. Hence, command CMD_1 can be, for example, an erase command, a program command, etc. The first operation may include a plurality of periods. This will be described in detail with reference to FIG. 6.

Figures 5, 6:
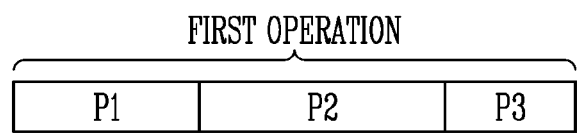
FIG. 5 is a diagram illustrating a command requesting the information on the target period shown in FIG. 4.
FIG. 6 is a diagram illustrating a first operation and a plurality of periods included in the first operation in accordance with an embodiment of the present disclosure.

The suspend controller 220 may receive a request for a second operation from the host while the memory device 100 is performing the first operation. The suspend controller 220 may provide the operation processor 131 of the memory device 100 with a first suspend command Suspend_1 instructing the memory device 100 to suspend performance of the first operation. The second operation may be a read operation of outputting data stored at a physical address corresponding to a logical address requested by the host. The operation processor 131 may suspend the performance of the first operation in response to the first suspend command Suspend_1. After the suspend controller 220 provides the first suspend command Suspend_1, the suspend controller 220 may provide the suspend information manager 132 with a command SUS_INF_REQ requesting information on a target period among the plurality of periods included in the first operation. The target period may be information on a period in which the first operation is suspended among the plurality of periods. Referring to FIG. 5, the command SUS_INF_REQ requesting the information on the target period may include any one of a status read command Status Read, a parameter get command Get Parameter, and a feature get command Get Feature. When the suspend information manager 132 receives the command SUS_INF_REQ requesting the information on the target period from the suspend controller 220, the suspend information manager 132 may provide the operation processor 131 with a command TAR_PD_INF_REQ requesting information on the target period. The operation processor 131 may provide information TAR_PD_INF_PVD on the target period to the suspend information manager 132 in response to the command TAR_PD_INF_REQ. The suspend information manager 132 may provide the delay information storage 230 of the memory controller 200 with the information TAR_PD_INF_PVD on the target period as SUS_INF_PVD, which is received from the operation processor 131.

The delay information storage 230 may store a plurality of delay information. The delay information may include delay values corresponding to a plurality of periods included in each operation. The delay information may be information on a period exceeding a setup period included in the target period. The setup period will be described in detail with reference to FIG. 7. The delay information storage 230 may provide the suspend controller 220 with delay information DLY_INF_PVD corresponding to information SUS_INF_PVD on the target period, which is received from the suspend information manager 132, among the plurality of stored delay information.

The suspend controller 220 may provide the delay information storage 230 with command DLY_INF_REQ requesting delay information, and the delay information storage 230 may provide the delay information DLY_INF_PVD to the suspend controller 220 in response to a corresponding request. The delay information storage 230 may output delay information, based on the information on the target period.

When the memory device 100 ends the second operation, the suspend controller 220 may provide the operation processor 131 with a resume command Resume_1 instructing the memory device 100 to resume the performance of the first operation which has been suspended. When the host requests the storage device to perform a third operation while the memory device 100 is performing the first operation which has been suspended, the suspend controller 220 may provide the operation processor 131 with a second suspend command Suspend_2 instructing the memory device 100 to re-suspend the performing of the first operation after a corresponding delay elapses, based on the delay information DLY_INF_PVD.

FIG. 5 is a diagram illustrating a command requesting the information on the target period shown in FIG. 4.

The memory controller may perform a status check operation for checking which memory devices are available. For example, the memory controller may input a status read command to memory devices, and obtain information indicating which memory device is operating and which memory devices are not operating according to a ready/busy signal output from the memory devices in response to the status read command. When statuses of the memory devices are checked, the memory controller may select any one memory device among the memory devices which are not operating, and control the selected memory device to perform an operation of responding to a command received from the host.

In an embodiment of the present disclosure, the suspend controller may provide a status read command Status Read to the memory device. The status read command may be a command for checking an operation status of the memory device. The suspend controller may receive a status read response to the status read command from the memory device. The status read response may include a status code representing information on a period in which the first operation is suspended. When four periods P1, P2, P3, and P4 are included in a specific operation, the periods may correspond to different code values. For example, the status code may include codes value of 00, 01, 10, and 11 respectively corresponding to the periods P1, P2, P3, and P4. The number of status codes, the value of a status code, and a determination method of a status code are not limited to this embodiment.

A feature get command 'Get Feature' or a parameter get command 'Get Parameter' may be a command instructing the memory device to provide the memory controller with a specific attribute or parameter information, which is stored in a register of the memory device.

FIG. 6 is a diagram illustrating a first operation and a plurality of periods included in the first operation in accordance with an embodiment of the present disclosure.

Referring to FIG. 6, the first operation in accordance with the embodiment of the present disclosure may include a plurality of periods. For example, the first operation may include three periods P1, P2, and P3. The number of a plurality of periods is not limited to the embodiment of the present disclosure.

When assuming that the first operation is an erase operation of erasing data stored in a plurality of memory cells, the erase operation may include, for example, a plurality of erase loops, and each erase loop may include an erase phase and a verify phase. In the erase phase, an erase voltage may be applied to a channel region of a plurality of memory cell strings included in a memory block. A ground voltage may be applied to word lines connected to the memory block while the erase voltage is applied. In the verify phase, the memory device may determine whether memory cells included in the memory block have a threshold voltage corresponding to an erase state. Specifically, in an erase verify phase, an erase verify voltage may be applied to the word lines connected to the memory block. The level of the erase voltage may increase by a step voltage whenever the erase loop is repeated (e.g., using Incremental Step Pulse Erase (ISPE)).

When assuming that the first operation is a program operation of storing data in a plurality of memory cells, the program operation may include, for example, a plurality of program loops, and each program loop may include a program voltage application phase and a program verify phase. In the program voltage application phase, a program voltage may be applied to a selected word line connected to selected memory cells. In the program verify phase, a verify voltage may be applied to the selected word line, and a verify pass voltage may be applied to unselected word lines. The level of the program voltage may increase by a step voltage whenever the program loop is repeated (e.g., using Incremental Step Pulse Programming (ISPP)).

In an embodiment, P2 may be any one of the erase phase and the erase verify phase. In another embodiment, P2 may be any one loop among the plurality of erase loops. In an embodiment, P2 may be any one of the program voltage application phase and the program verify phase. In another embodiment, P2 may be any one program loop among the plurality of program loops.

As described in the embodiment of the present disclosure, one operation in the memory device may include a plurality of periods, and voltages having different magnitudes may be applied to the plurality of periods.

Figure 7:
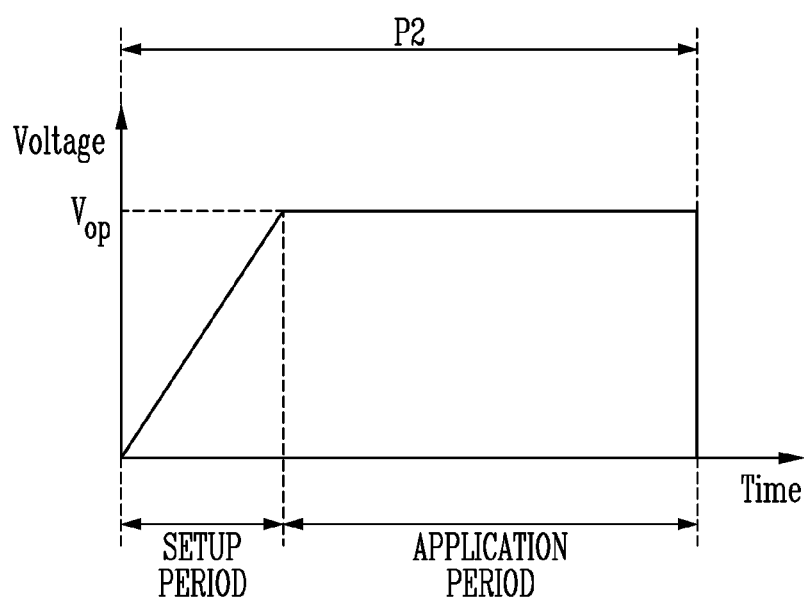
FIG. 7 is a diagram illustrating a setup period and an application period, which are included in any one period among the plurality of periods in accordance with an embodiment of the present disclosure.

FIG. 7 is a diagram illustrating a setup period and an application period, which are included in any one period among the plurality of periods in accordance with an embodiment of the present disclosure.

Referring to FIG. 7, the first operation may be an erase operation, and the period P2 may correspond to any one period among a plurality of periods included in the erase operation. In another embodiment, the first operation may be a program operation, and the period P2 may correspond to any one period among a plurality of periods included in the program operation.

Each of the plurality of periods may include a setup period and an application period. The setup period may be a period in which an operation voltage $V_{OP}$ to be applied to memory cells is driven, and the application period may be a period in which the operation voltage $V_{OP}$ is applied to a plurality of memory cells. When the application period elapses, the operation of the memory device in the period P2 may be ended. In an embodiment of the present disclosure, the operation voltage Vop may be an erase voltage used in an erase loop or a program voltage used in a program loop.

Figure 8:
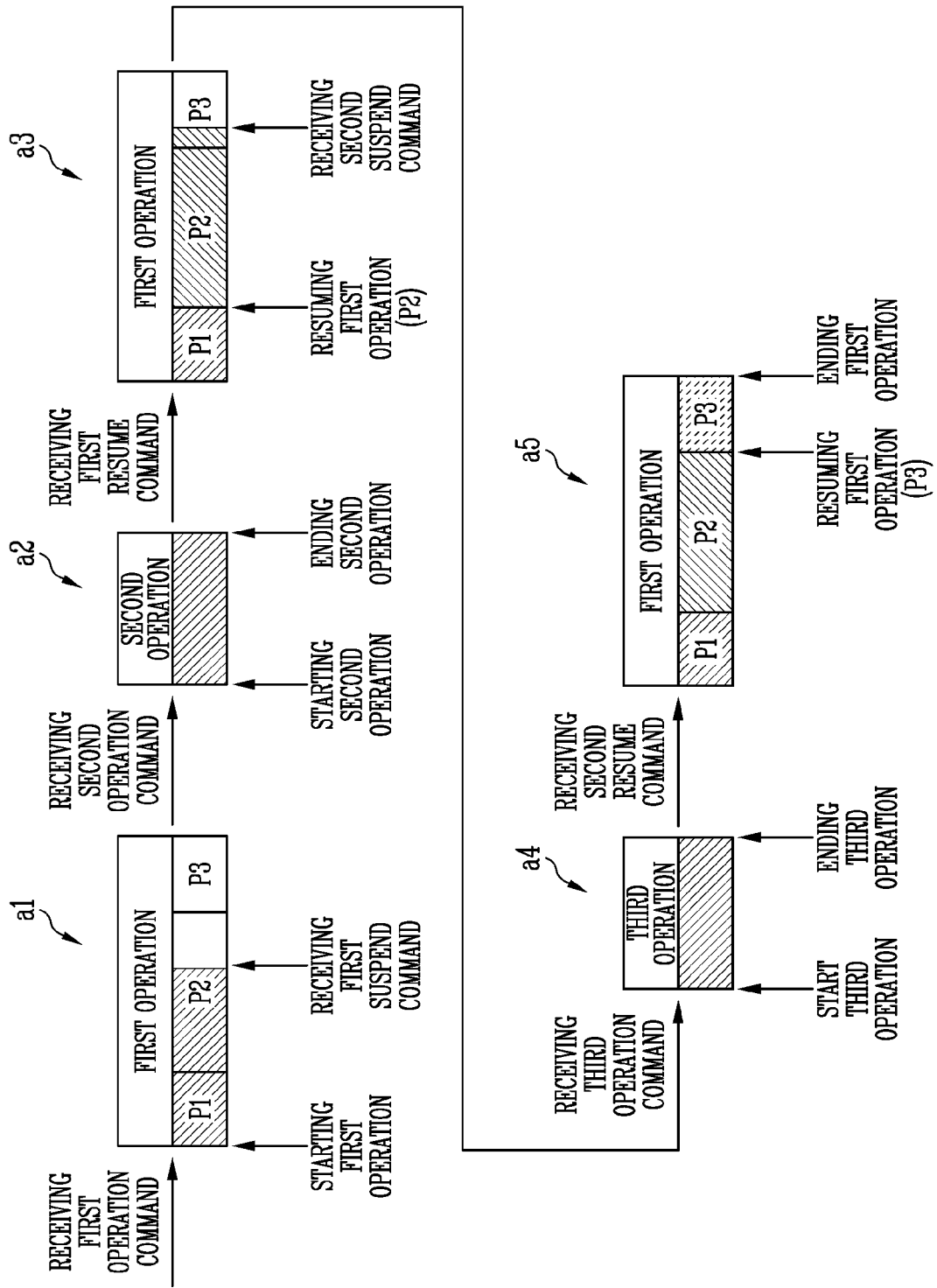
FIG. 8 is a diagram illustrating an operation of the memory device receiving a suspend command while the first operation is being performed in accordance with an embodiment of the present disclosure.

FIG. 8 is a diagram illustrating an operation of the memory device receiving a suspend command while the first operation is being performed in accordance with an embodiment of the present disclosure.

Referring to FIG. 8, the first operation may correspond to, for example, an erase operation or a program operation, and the second operation and the third operation may correspond to a read operation. The first operation may include a plurality of periods P1, P2, and P3. The number of a plurality of periods is not limited to this embodiment. When performance of another operation is required while the memory device is performing the erase operation or the program operation, the memory controller may suspend the operation being performed. Specifically, the memory controller may provide a suspend command to the memory device. The memory device receiving the suspend command may suspend the operation being performed.

When the host requests the second operation from the storage device while the first operation is being performed, the memory controller may provide the memory device with a first suspend command instructing the memory device to suspend the first operation. The memory device may suspend the performance of the first operation in response to the command.

In an embodiment of the present disclosure, the memory controller may provide the memory device with a command requesting information on a target period P2, and the memory device may provide information on the target period P2 in response to the command. The target period may be information on a period in which the first operation is suspended among the plurality of periods. The memory controller may obtain the information on the target period P2 from the memory device. The memory controller may provide the memory device with a command instructing the second operation, and the memory device may perform the second operation in response to the command. When the second operation is ended (e.g., when data is read if the second operation is a read operation), the memory controller may provide the memory device with a first resume command instructing the memory device to resume the first operation which has been suspended. The memory device may resume the first operation which has been suspended in response to the first resume command. When the host requests the third operation from the storage device while the memory device is performing the first operation, the memory controller may provide the memory device with a second suspend command instructing the memory device to re-suspend the first operation. The memory controller may determine a delay corresponding to the target period P2 among a plurality of delay information stored in the delay information storage, based on the information on the target period P2. The memory controller may provide the second suspend command to the memory device after the delay corresponding to the target period P2 elapses. The memory device may re-suspend the performance of the first operation in response to the second suspend command. The memory controller may provide the memory device with a command requesting information on a target period P3. The memory device may provide the memory controller with the information on the target period P3 in response to the command. The memory controller may determine a delay corresponding to the target period P3 among the plurality of delay information stored in the delay information storage, based on the information on the target period P3. The memory device may perform the third operation in response to a command instructing the third operation, which is provided from the memory controller. When the third operation is ended, the memory device may resume the first operation in response to a second resume command provided from the memory controller. The first operation may be ended when all the periods P1, P2, and P3 included in the first operation are completed.

In some instances, the second suspend command shown in FIG. 8 may occur in target period P2 instead of target period P3.

Figure 9A:
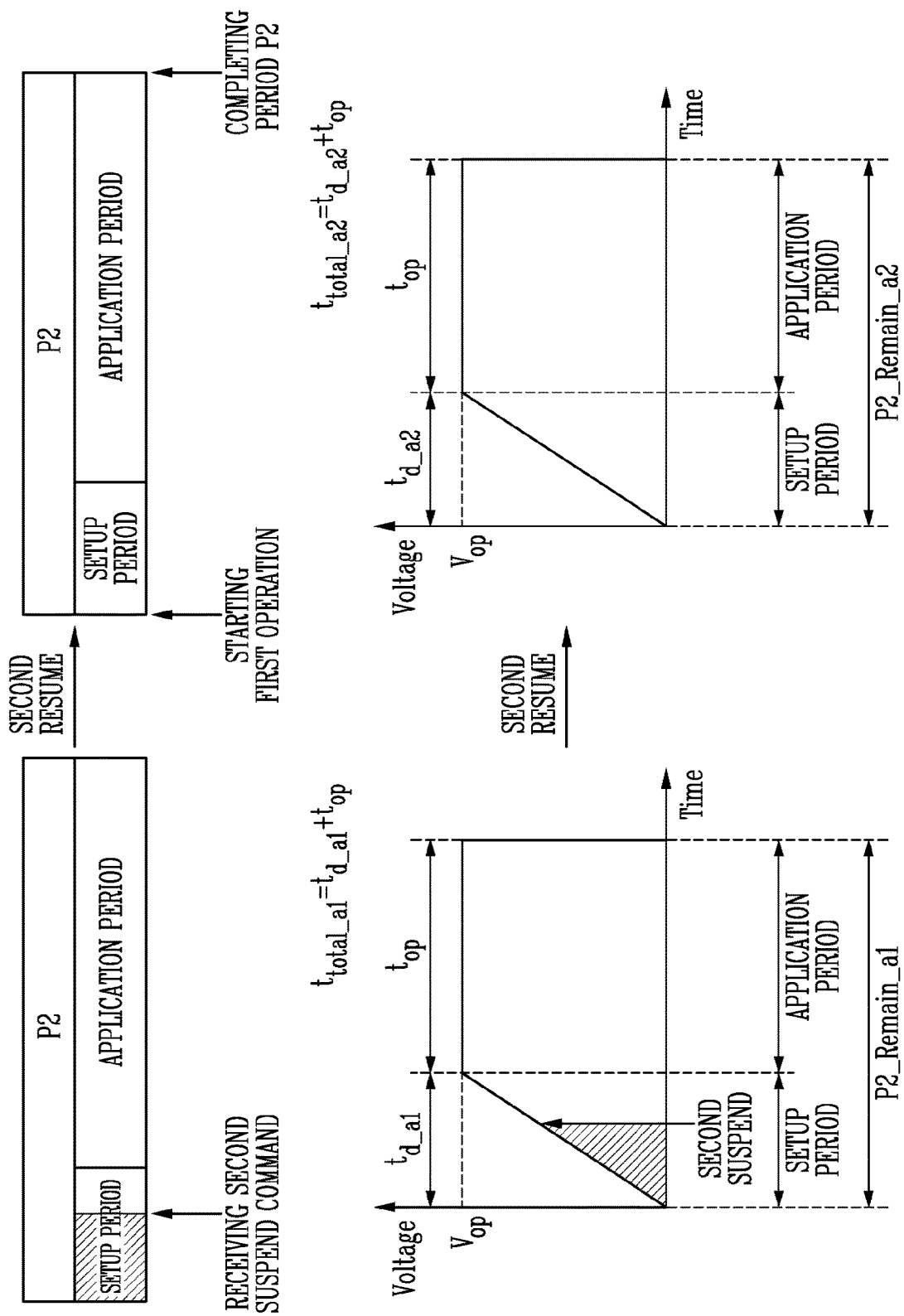
FIG. 9A is a diagram illustrating an operation of the memory device receiving the suspend command in the setup period in accordance with an embodiment of the present disclosure.

Referring to FIG. 9A, in an embodiment of the present disclosure, the period P2 may include a setup period and an application period. FIG. 9A is a diagram illustrating an operation of the memory device receiving the second suspend command in the setup period of P2 in accordance with an embodiment of the present disclosure Timing parameter $t_{d\_a1}$ may be a period from a time at which the first operation is resumed by the first resume command to when the setup period is completed.

Timing parameter $t_{d\_a2}$ may be a period from a time at which the first operation is resumed by the second resume command to when the setup period is completed.

Timing parameter $t_{op}$ may be a period from a time at which the application period is started to a time at which the application period is completed.

P2_Remain_a1 may be a period remaining until the period P2 is completed with respect to a time at which the period P2 is resumed by the first resume command.

P2_Remain_a2 may be a period remaining until the period P2 is completed with respect to at a time at which the period P2 is resumed by the second resume command.

Timing parameter $t_{total\_a1}$ may mean a period from the time at which the period P2 is resumed by the first resume command to a time at which the period P2 is completed, and the period may correspond to a value obtained by adding $t_{d\_a1}$ and $t_{op}$.

Timing parameter $t_{total\_a2}$ may mean a period from the time at which the period P2 is resumed by the second resume command to a time at which the period P2 is completed, and the period may correspond to a value obtained by adding $t_{d\_a2}$ and $t_{op}$.

As described above, the memory device may re-suspend the first operation when the memory device receives the second suspend command from the memory controller while the first operation is being performed in response to the first resume command. FIG. 9A illustrates a graph of operation voltage according to time, when the memory device receives the second suspend command from the memory controller while performing the first operation in the setup period. Referring to FIG. 9A, when the memory device re-suspends the first operation in response to the second suspend command from the memory controller in the setup period, a period corresponding to $t_{d\_a2}$ may be required so as to reach the operation voltage Vop when the memory device subsequently resumes the first operation in response to the second resume command. The period may be a period equal to $t_{d\_a1}$ as a period from the time at which the first operation is resumed by the first resume command to when the setup period is completed. Consequently, $t_{total\_a1}$ being the period from the time at which the period P2 is resumed by the first resume command to the time at which the period P2 is completed may be equal to $t_{total\_a2}$ being the period from the time at which the period P2 is resumed by the second resume command to the time at which the period P2 is completed. When the memory device repeatedly receives a suspend command from the memory controller in the setup period as exemplified in FIG. 9A, the operation is not ended, but suspend and resume operations will be repeated. When an operation is resumed after a suspend command, the setup period may need to be restarted to obtain the operation voltage Vop. If the suspend command is received during the setup period, the operation may not progress because the application period has not yet started. Hence, receiving the suspend command repeatedly during the setup period may cause the operation to not complete.

FIG. 9B is a diagram illustrating an operation of the memory device receiving the suspend command in the application period in accordance with an embodiment of the present disclosure.

Referring to FIG. 9B, in the embodiment of the present disclosure, the period P2 may include a setup period and an application period.

Timing parameter $t_{d\_b1}$ may be a period from a time at which the period P2 is resumed by the first resume command to when the setup period is ended.

Timing parameter $t_{d\_b2}$ may be a period from at a time at which the period P2 is resumed by the second resume command to when the setup period is completed.

Timing parameter $t_{op}$ may be a period from a time at which the application period is started to a time at which the application period is completed.

P2_Remain_b1 may be a period remaining until the period P2 is completed with respect to a time at which the period P2 is resumed by the first resume command.

P2_Remain_b2 may be a period remaining until the period P2 is completed with respect to a time at which the period P2 is resumed by the second resume command.

Timing parameter $t_{total\_b1}$ may mean a period from the time at which the period P2 is resumed by the first resume command to a time at which the period P2 is completed, and the period may correspond to a value obtained by adding $t_{d\_b1}$ and $t_{op}$.

Timing parameter $t_{total\_b2}$ may mean a period from the time at which the period P2 is resumed by the second resume command to a time at which the period P2 is completed, and the period may correspond to a value obtained by subtracting $t_p$ from a value obtained by adding $t_{d\_b2}$ and $t_{op}$.

Timing parameter $t_p$ corresponds to a period from a time at which the application period is started in P2_Remain_b1 to at a time at which the second suspend command is provided to the memory device, and may be a period in which the first operation is effectively performed in the application period after the setup period is completed in P2_Remain_b1.

Referring to FIG. 9B, when the memory device re-suspends the first operation in response to the second suspend command from the memory controller in the application period, it may be unnecessary for the memory device to again perform a portion completed in the application period to the time at which the first operation is re-suspended when the memory device resumes the first operation in response to the second resume command. Consequently, $t_{total\_b2}$ as the period from the time at which the period P2 is resumed by the second resume command to the time at which the period P2 is completed may correspond to a period obtained by subtracting $t_p$ as the period in which the first operation is effectively performed in the application period after the setup period is completed from $t_{total\_b1}$ as the period from the time at which the period P2 is resumed by the first resume command to the time at which the period P2 is completed. When the memory device repeatedly receives a suspend command in the application period as exemplified in FIG. 9B, the operation can complete by performing a portion of the application period each time the operation is resumed, unlike the example shown in FIG. 9A.

Figures 10, 11:
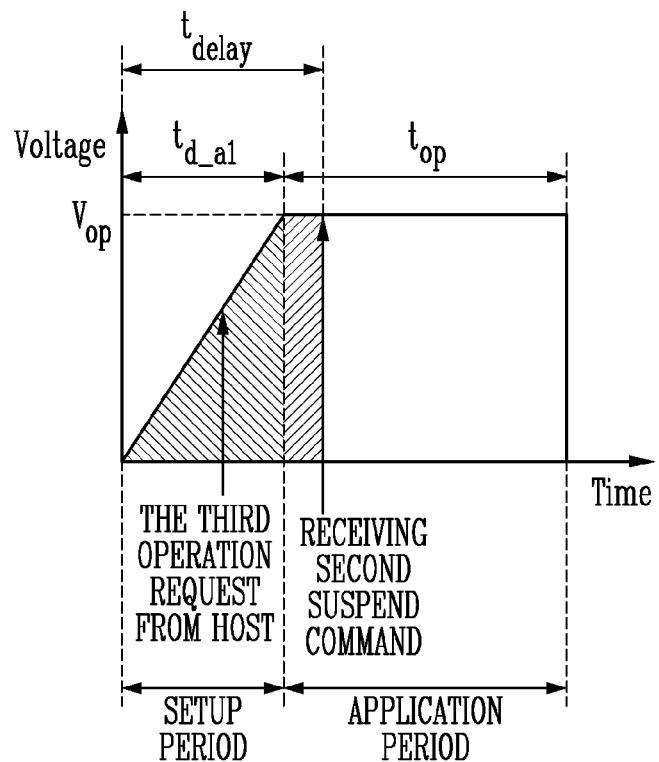
FIG. 10 is a diagram illustrating operations of the memory controller and a memory device when a third operation request is received from the host in the setup period in accordance with an embodiment of the present disclosure.
FIG. 11 is a diagram illustrating delay information.

FIG. 10 is a diagram illustrating operations of the memory controller and the memory device when a third operation request is received from the host in the setup period in accordance with an embodiment of the present disclosure.

Referring to FIG. 10, when the storage device receives a third operation request while the memory device is performing the first operation in the setup period in response to the first resume command, the memory controller may provide a suspend command to the memory device after $t_{delay}$ elapses. $t_{delay}$ may be a period exceeding a period corresponding to the setup period of the target period P2. As exemplified in FIG. 10, although the storage device receives the third operation request from the host in the setup period, the memory controller may provide the suspend command to the memory device after $t_{delay}$ elapses. Therefore, although the host requests an operation during the setup period, suspension of the operation can be delayed until some portion of the application period has been performed to allow the operation to complete even if the host repeatedly requests an operation during a setup period.

FIG. 11 is a diagram illustrating delay information.

Referring to FIG. 11, the delay information may include a plurality of delay values corresponding to a plurality of periods included in the first operation. In FIG. 11, the first operation may include a plurality of periods P1, P2, P3, and P4.

In an embodiment, the memory controller may determine a delay value corresponding to a target period among a plurality of delay values stored in the delay information storage, based on information on the target period, which is received from the memory device.

In Case 1, the delay information may include a plurality of delay values d1 to d4 corresponding to the plurality of periods P1 to P4. Delay values corresponding to the periods may be different from each other.

In Case 2, the delay information may include a plurality of delay values d5 and d6 corresponding to the plurality of periods P1 to P4. Each period may correspond to any one the plurality of delay values d5 and d6.

In some implementations, the delay information may include a plurality of delay values respectively mapped to the plurality of periods (e.g., Case 1). The delay information may include delay values having different lengths for different periods in the plurality of periods. The delay information may include delay values having the same length for two or more periods in the plurality of periods. The number of different delay values in the plurality of delay values can be smaller than or equal to the number of periods in the plurality of periods (e.g., Case 2). The plurality of periods can have two or more periods that have the same length of setup period, and/or two or more periods that have different lengths of setup period. The length of a setup period can be determined according to a magnitude of the operation voltage.

Figure 12:
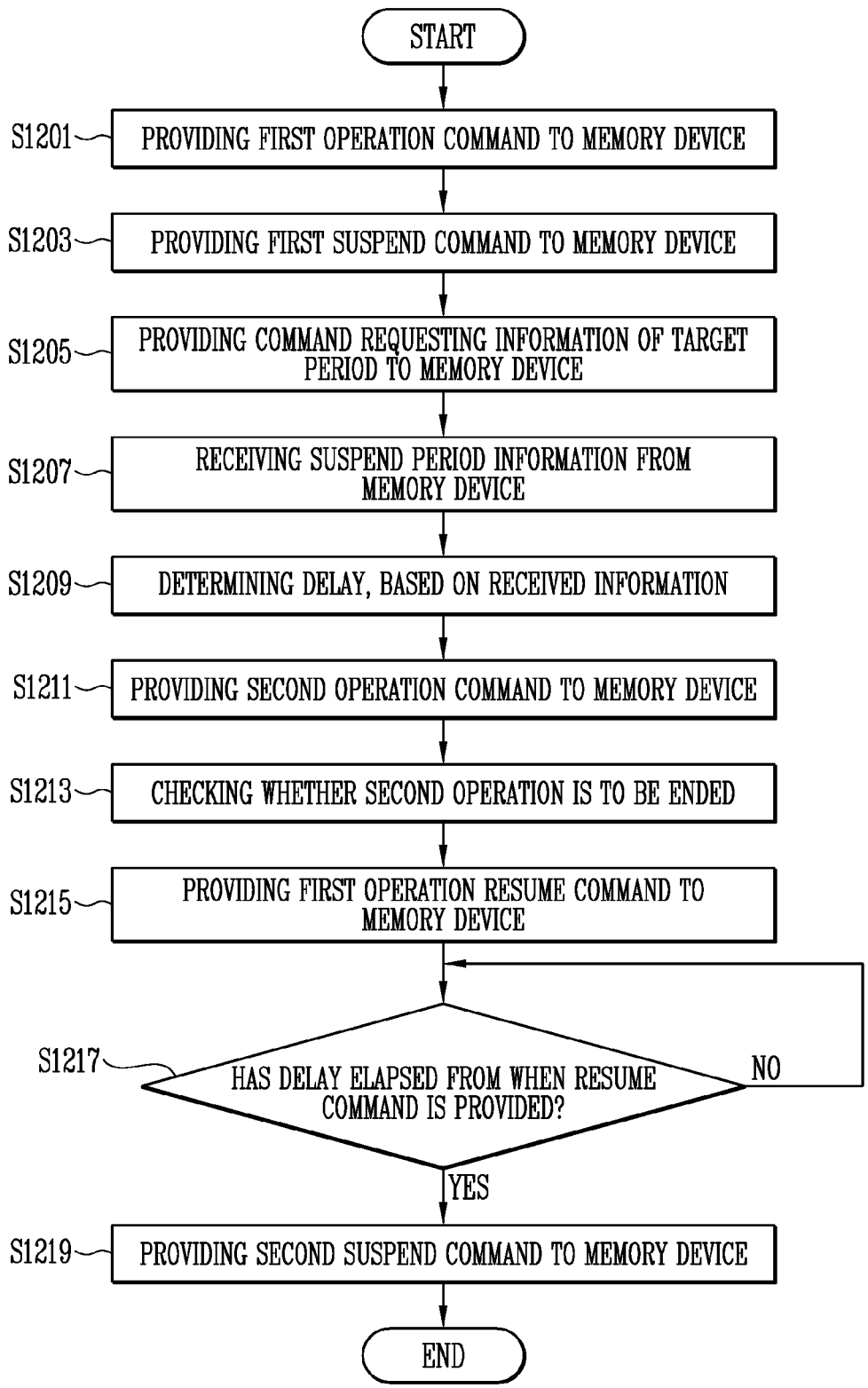
FIG. 12 is a flowchart illustrating an operation of the memory controller in accordance with an embodiment of the present disclosure.

FIG. 12 is a flowchart illustrating an operation of the memory controller in accordance with an embodiment of the present disclosure.

Referring to FIG. 12, in step S1201, the memory controller may provide a first operation command to the memory device. A first operation may be a program operation or an erase operation.

In step S1203, the memory controller may provide the memory device with a first suspend command instructing the memory device to suspend performance of the first operation while the memory device is performing the first operation.

In step S1205, the memory controller may provide the memory device with a command requesting the information on the target period as information on a time at which the memory device suspends the first operation.

In step S1207, the memory controller may receive, from the memory device, suspend period information as information on the time at which the memory device suspends the first operation.

In step S1209, the memory controller may determine a delay, based on the received suspend period information. The delay may be stored in the delay information storage of the memory controller.

In step S1211, the memory controller may provide a second operation command to the memory device. A second operation may be a read operation.

In step S1213, the memory controller may check whether the memory device is to end the second operation. For example, the second operation may end when the requested data has been read.

In step S1215, the memory controller may provide the memory device with a first operation resume command instructing the memory device to resume the first operation which has been suspended.

In step S1217, the memory controller may determine whether the delay has elapsed from when the memory controller provides the resume command. When the delay elapses from when the memory controller provides the resume command as a determination result, the memory controller may proceed to step S1219. When the delay does not elapse from when the memory controller provides the resume command as a determination result, the memory controller may stand by.

In the step S1219, the memory controller may provide a second suspend command to the memory device.

Figure 13:
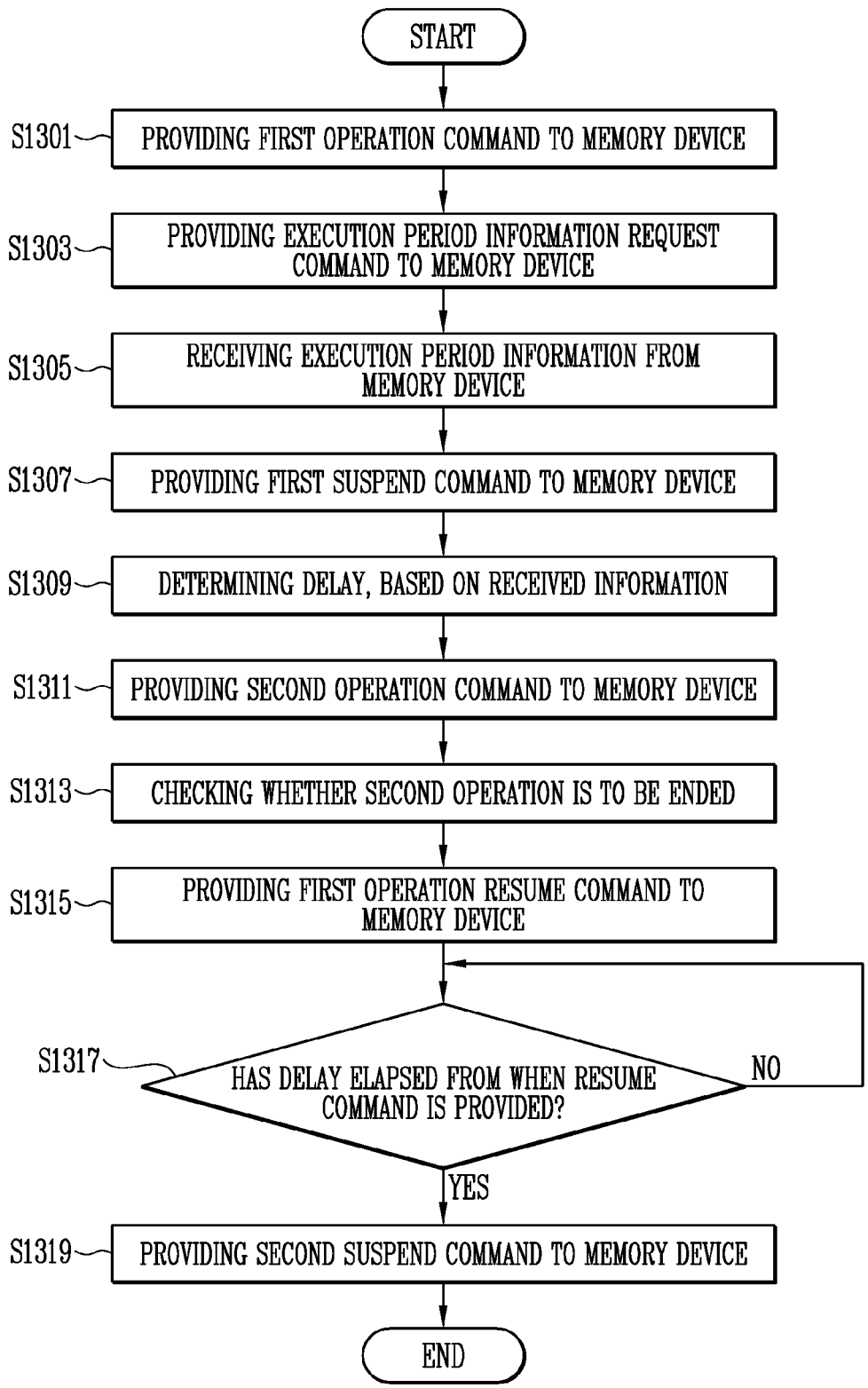
FIG. 13 is a flowchart illustrating an operation of the memory controller in accordance with another embodiment of the present disclosure.

FIG. 13 is a flowchart illustrating an operation of the memory controller in accordance with another embodiment of the present disclosure.

Referring to FIG. 13, in step S1301, the memory controller may provide a first operation command to the memory device. A first operation may be a program operation or an erase operation.

In step S1303, while the memory device is performing the first operation, the memory controller may provide the memory device with an execution period information request command requesting information on which period among a plurality of periods included in the first operation an operation is being performed.

In step S1305, the memory controller may receive execution period information from the memory device.

In step S1307, the memory controller may provide the memory device with a first suspend command instructing the memory device to suspend performance of the first operation being performed.

In step S1309, the memory controller may determine a delay, based on the received execution period information. The delay may be stored in the delay information storage of the memory controller.

In step S1311, the memory controller may provide a second operation command to the memory device. A second operation may be a read operation.

In step S1313, the memory controller may check whether the memory device is to end the second operation. Subsequently, in step S1315, the memory controller may provide the memory device with a first operation resume command instructing the memory device to resume the first operation which has been suspended.

In step S1317, the memory controller may determine whether the delay has elapsed from when the memory controller provides the resume command. When the delay elapses from when the memory controller provides the resume command as a determination result, the memory controller may proceed to step S1319. When the delay does not elapse from when the memory controller provides the resume command as a determination result, the memory controller may stand by.

In step S1319, the memory controller may provide a second suspend command to the memory device.

Figure 14:
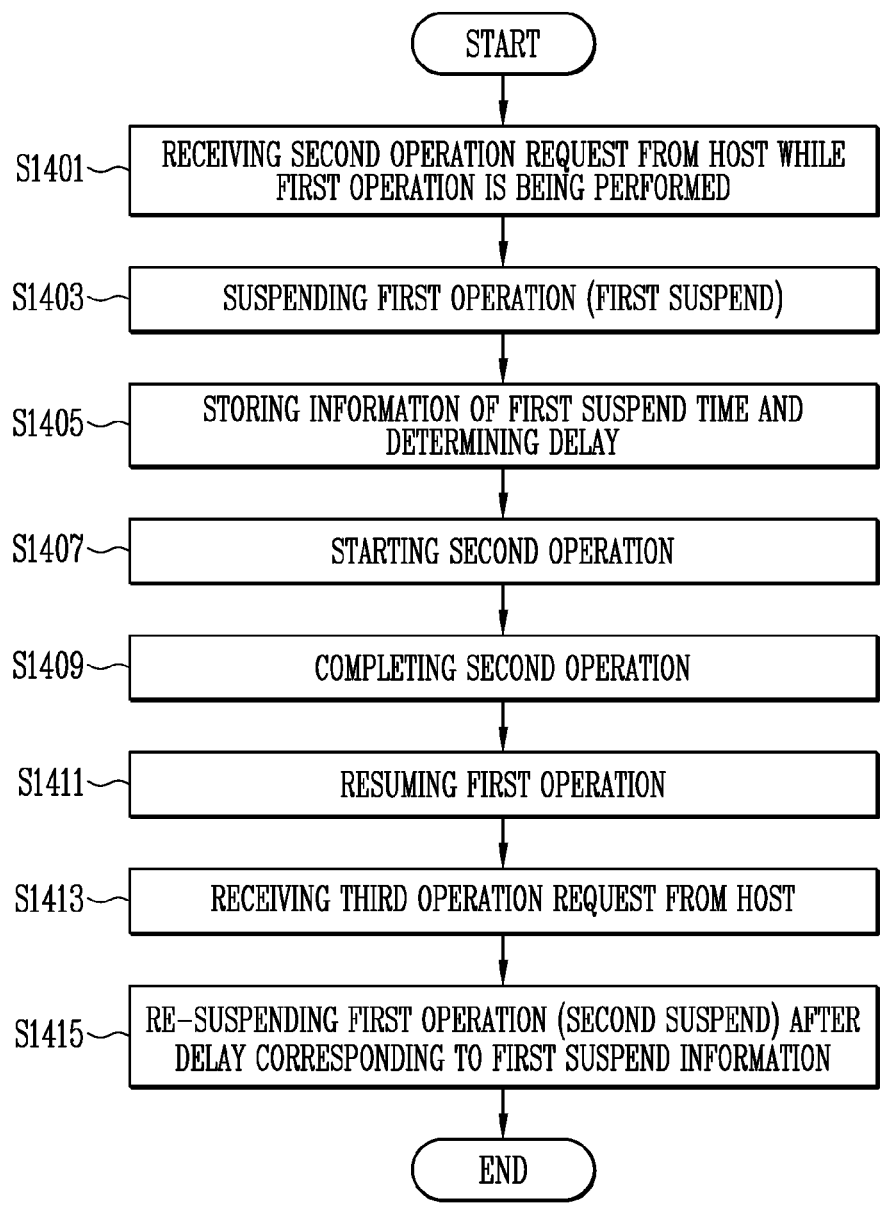
FIG. 14 is a flowchart illustrating an operation of the storage device in accordance with an embodiment of the present disclosure.

FIG. 14 is a flowchart illustrating an operation of the storage device in accordance with an embodiment of the present disclosure.

In step S1401, the storage device may receive a second operation request from the host while a first operation is being performed.

In step S1403, the storage device may suspend the first operation being performed.

In step S1405, the storage device may determine a delay, based on information of a first suspend time as a time at which the first operation is suspended.

In step S1407, the storage device may start a second operation.

In step S1409, the storage device may end the second operation.

In step S1411, the storage device may resume the first operation which has been suspended.

In step S1413, the storage device may receive a third operation request from the host.

In step S1415, the storage device may re-suspend the first operation being performed after the delay corresponding to the first suspend information elapses.

Figure 15:
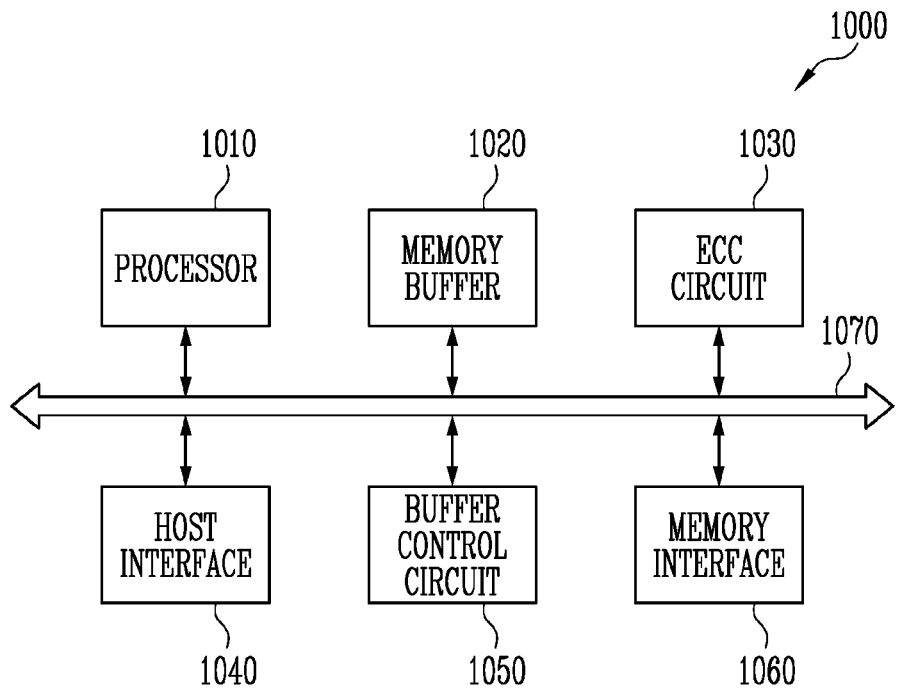
FIG. 15 is a diagram illustrating another embodiment of the memory controller shown in FIG. 1.

FIG. 15 is a diagram illustrating another embodiment of the memory controller shown in FIG. 1.

Referring to FIG. 15, a memory controller 1000 is connected to the host and the memory device. The memory controller 1000 may access the memory device in response to a request received from the host. For example, the memory controller 1000 may control write, read, erase, and background operations of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to translate the LBA into a PBA. Several address mapping methods of the FTL exist according to mapping units. A representative address mapping method includes a page mapping method, a block mapping method, and a hybrid mapping method.

The processor 1010 may randomize data received from the host. For example, the processor 1010 may randomize data received from the host, using a randomizing seed. The randomized data is provided as data to be stored to the memory device to be programmed in the memory cell array.

In a read operation, the processor 1010 may derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 16:
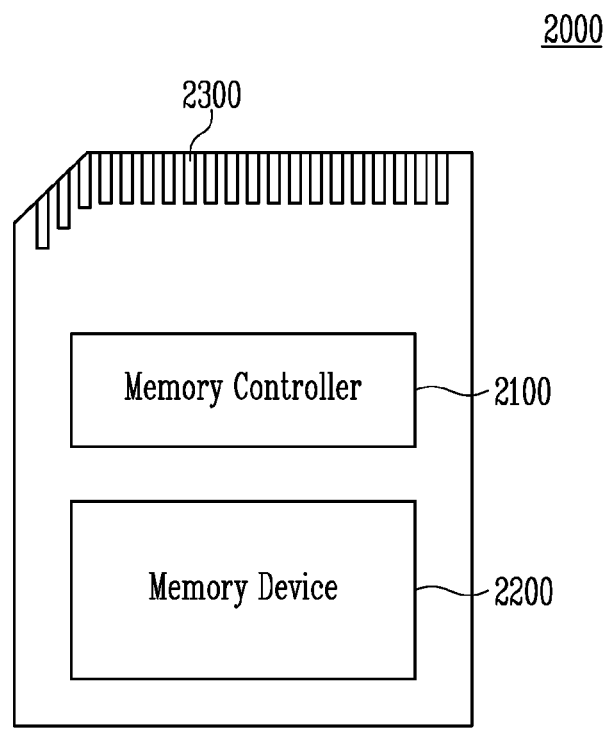
FIG. 16 is a block diagram illustrating a memory card system to which the storage device is applied in accordance with an embodiment of the present disclosure.

FIG. 16 is a block diagram illustrating a memory card system to which the storage device is applied in accordance with an embodiment of the present disclosure.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to execute firmware for controlling the memory device 2200. The memory controller 2100 may be implemented identically to the memory controller 200 described with reference to FIG. 1.

Exemplarily, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. Exemplarily, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

Exemplarily, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 17:
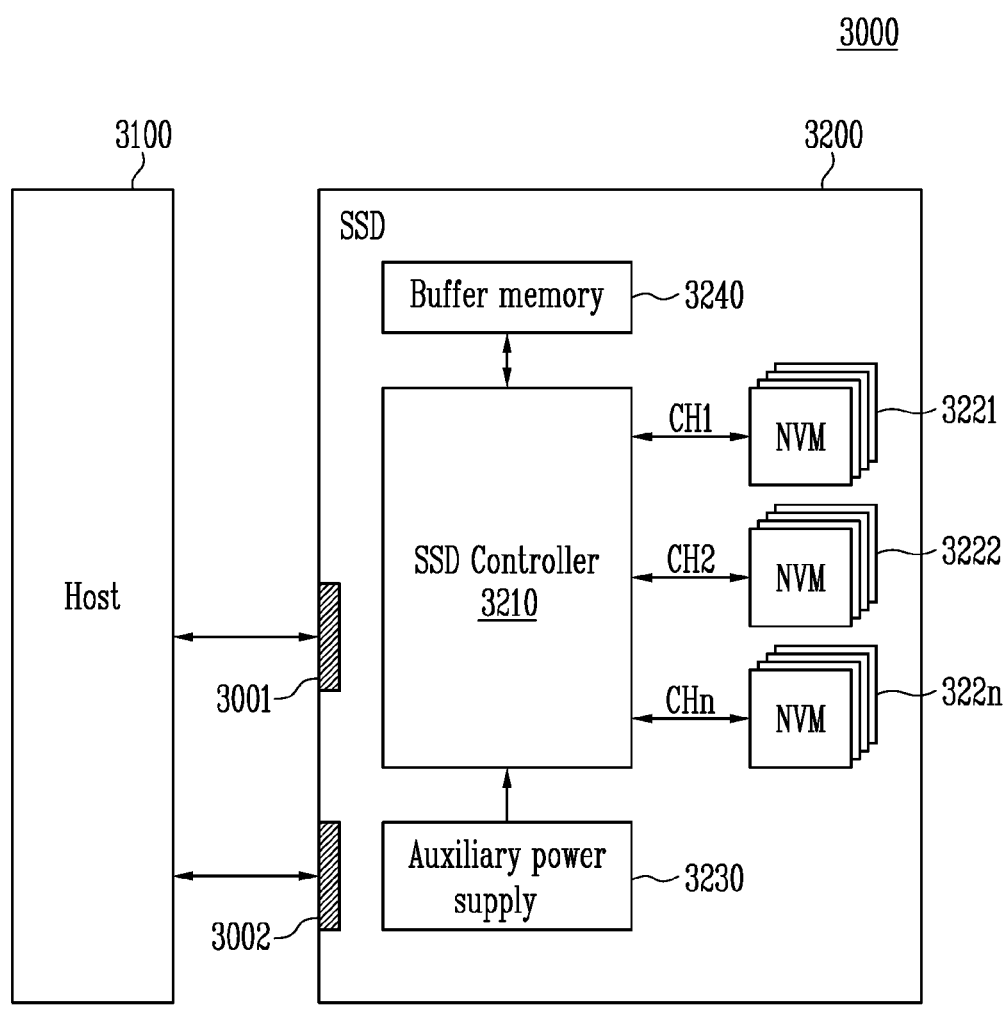
FIG. 17 is a block diagram illustrating a Solid State Drive (SDD) to which the storage device is applied in accordance with an embodiment of the present disclosure.

FIG. 17 is a block diagram illustrating a Solid State Drive (SDD) to which the storage device is applied in accordance with an embodiment of the present disclosure.

Referring to FIG. 17, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In accordance with an embodiment of the present disclosure, the SSD controller 3210 may serve as the memory controller 200 described with reference to FIG. 1.

The SSD controller 3210 may control the plurality of flash memories 3221 to 322n in response to a signal SIG received from the host 3100. Exemplarily, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. Exemplarily, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 18:
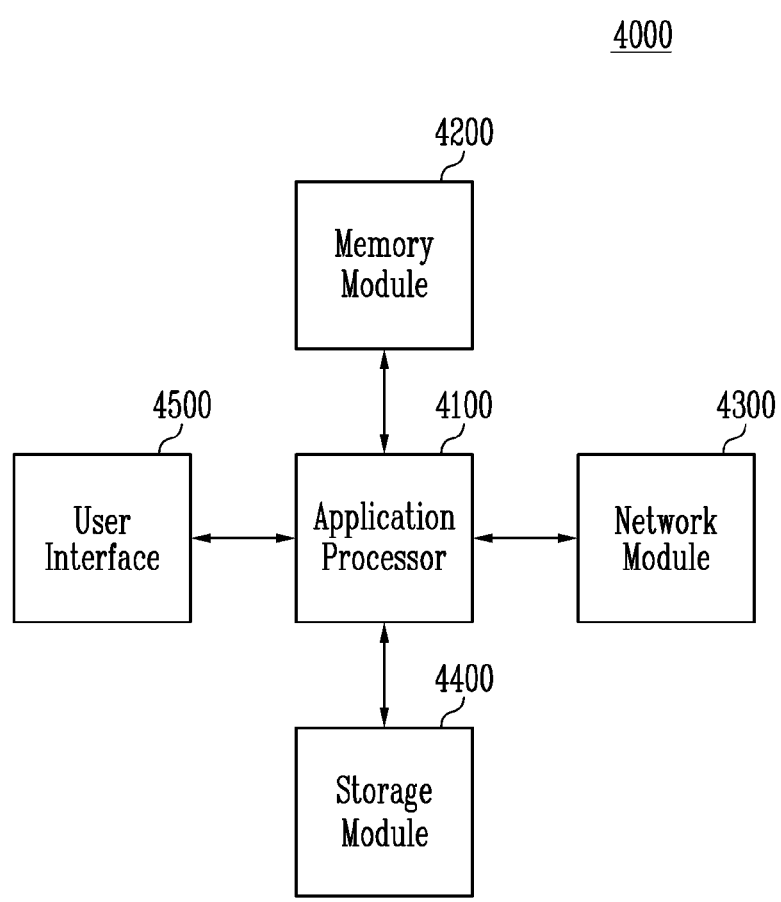
FIG. 18 is a block diagram illustrating a user system to which the storage device is applied in accordance with an embodiment of the present disclosure.

FIG. 18 is a block diagram illustrating a user system to which the storage device is applied in accordance with an embodiment of the present disclosure.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. Exemplarily, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. Exemplarily, the storage module 4400 may be provided as a removable drive such as a memory card of the user system 4000 or an external drive.

Exemplarily, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. Exemplarily, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device having improved suspend and resume performance and an operating method of the storage device.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory controller for controlling an operation of a memory device including a plurality of memory cells, the memory controller comprising:
   an operation controller configured to provide the memory device with a command instructing a first operation including a plurality of periods;
   a suspend controller configured to provide the memory device with a first suspend command instructing the memory device to suspend performance of the first operation and then provide the memory device a command requesting information on a target period in which the first operation is suspended among the plurality of periods; and
   a delay information storage configured to store delay information corresponding to each of the plurality of periods,
   wherein the operation controller provides the memory device with a command instructing a second operation, after the suspend controller provides the memory device with the command requesting the information on the target period, and
   wherein the suspend controller provides the memory device with a resume command instructing the memory device to resume the performance of the first operation after the second operation is ended, and provides the memory device with a second suspend command instructing the memory device to re-suspend the performance of the first operation after a delay elapses from a time at which the resume command is provided, wherein the delay is based on the delay information corresponding to the target period.

2. The memory controller of claim 1, wherein the first operation is one of an erase operation of erasing data stored in the plurality of memory cells or a program operation of storing data in the plurality of memory cells.

3. The memory controller of claim 1, wherein the command requesting the information on the target period is one of a status read command, a parameter get command, or a feature get command.

4. The memory controller of claim 1, wherein each of the plurality of periods includes a setup period and an application period, and
   wherein the setup period is a period in which an operation voltage to be applied to the plurality of memory cells is generated, and
   the application period is a period in which the operation voltage is applied to the plurality of memory cells.

5. The memory controller of claim 4, wherein a setup period of a first period in the plurality of periods has a length different from that of a second period in the plurality of periods.

6. The memory controller of claim 4, wherein a length of the setup period included in each of the plurality of periods corresponds to any one of a plurality of different values.

7. The memory controller of claim 4, wherein a length of each setup period is determined according to a magnitude of the operation voltage.

8. The memory controller of claim 4, wherein the delay information includes delay values having different lengths for different periods in the plurality of periods.

9. The memory controller of claim 4, wherein the delay information includes a plurality of different delay values, and the plurality of periods correspond to any one delay value among the plurality of different delay values.

10. The memory controller of claim 9, wherein a number of different delay values is smaller than or equal to a number of periods in the plurality of periods.

11. A storage device comprising:
    a memory device configured to perform an operation including a plurality of periods on a plurality of memory cells, suspend performance of the operation in response to a first suspend command, generate information on a period in which the performance of the operation is suspended among the plurality of periods, and resume the performance of the operation in response to a resume command; and
    a memory controller configured to obtain the information on the period in which the performance of the operation is suspended from the memory device after the first suspend command is provided to the memory device, and provide a second suspend command to the memory device after a delay elapses from when the resume command is provided to the memory device, wherein the delay is determined according to the period in which the performance of the operation is suspended.

12. The storage device of claim 11, wherein the operation including the plurality of periods is one of an erase operation of erasing data stored in the plurality of memory cells or a program operation of storing data in the plurality of memory cells.

13. The storage device of claim 11, wherein the information on the period in which the performance of the operation is suspended is obtained by a command being one of a status read command, a parameter get command, or a feature get command.

14. The storage device of claim 11, wherein each of the plurality of periods includes a setup period in which an operation voltage to be applied to the plurality of memory cells is driven, and an application period in which the operation voltage is applied to the plurality of memory cells.

15. The storage device of claim 14, wherein a length of a setup period of a first period in the plurality of periods is different from that of a second period in the plurality of periods.

16. The storage device of claim 14, wherein a length of each setup period is determined according to a magnitude of the operation voltage.

17. The storage device of claim 14, wherein each of the plurality of periods has a different delay value.

18. The storage device of claim 14, wherein the plurality of periods correspond to any one of a plurality of delay values.

19. The storage device of claim 18, wherein a number of different delay values in the plurality of delay values is equal to or smaller to a number of periods in the plurality of periods.

20. A method for operating a memory controller for controlling a memory device including a plurality of memory cells, the method comprising:
provniding the memory device with a first suspend command instructing the memory device to suspend performance of a first operation while the first operation is being performed;
providing the memory device with a command requesting information on a period in which the first operation is suspended;
determining delay information corresponding to the period in which the first operation is suspended, based on the information on the period in which the first operation is suspended;
providing the memory device with a command to perform a second operation;
providing the memory device with a resume command instructing the memory device to resume the performance of the first operation after the second operation has been performed; and
instructing the memory device to re-suspend the performance of the first operation after a delay has elapsed from when the resume command is provided, wherein the delay is based on the delay information corresponding to the period in which the first operation is suspended.

* * * * *